(12) United States Patent
Kim

(10) Patent No.: US 7,202,720 B2
(45) Date of Patent: *Apr. 10, 2007

(54) DELAY LOCKED LOOP HAVING A DUTY CYCLE CORRECTION CIRCUIT

(75) Inventor: Youn-cheul Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

This patent is subject to a terminal disclaimer.

(21) Appl. No.: 11/130,062

(22) Filed: May 16, 2005

(65) Prior Publication Data

US 2005/0212575 A1    Sep. 29, 2005

Related U.S. Application Data

(62) Division of application No. 10/804,936, filed on Mar. 19, 2004, now Pat. No. 7,116,149.

(30) Foreign Application Priority Data

May 22, 2003    (KR) ................... 03-32557

(51) Int. Cl.
   *H03L 7/06* (2006.01)
(52) U.S. Cl. ..................... 327/158; 327/175
(58) Field of Classification Search ..... None
   See application file for complete search history.

(56) References Cited

U.S. PATENT DOCUMENTS

| | | | | |
|---|---|---|---|---|
| 5,945,862 | A | 8/1999 | Donnelly et al. | 327/278 |
| 6,181,178 | B1 | 1/2001 | Choi | 327/175 |
| 6,342,801 | B1* | 1/2002 | Shin | 327/158 |
| 6,373,309 | B1* | 4/2002 | Bang | 327/175 |
| 6,518,809 | B1* | 2/2003 | Kotra | 327/175 |
| 6,643,787 | B1* | 11/2003 | Zerbe et al. | 713/400 |
| 6,643,790 | B1 | 11/2003 | Yu et al. | 713/500 |
| 6,735,669 | B2 | 5/2004 | Shin | 711/106 |
| 6,853,225 | B2 | 2/2005 | Lee | 327/158 |
| 6,859,081 | B2* | 2/2005 | Hong et al. | 327/175 |

* cited by examiner

Primary Examiner—Timothy P. Callahan
Assistant Examiner—Cassandra Cox
(74) Attorney, Agent, or Firm—Mills & Onello LLP

(57) ABSTRACT

There is provided a Delay Locked Loop (DLL) including a duty cycle correction circuit capable of controlling a duty error, when the duty error is generated in the DLL. The duty cycle correction circuit controls amounts of electric charges accumulated in storage units, in response to switching control signals received from the external, and outputs duty rate control signals each corresponding to a difference between the amounts of electric charges accumulated in the storage units. Therefore, the DLL including the duty cycle correction circuit can correct a duty cycle of a reference clock signal, in response to the duty rate control signals, and can output a reference clock signal with a duty cycle of 50%.

3 Claims, 4 Drawing Sheets

DELAY LOCKED LOOP HAVING A DUTY CYCLE CORRECTION CIRCUIT

This application is a divisional of U.S. application Ser. No. 10/804,936, filed on Mar. 19, 2004, now U.S. Pat. No. 7,116,149 which relies for priority upon Korean Patent Application No. 03-32557, filed on May 22, 2003, the contents of which are herein incorporated by reference in their entirety.

BACKGROUND OF THE INVENTION

1. Field of the Invention

The present invention relates to a duty cycle correction circuit of a delay locked loop (DLL) and the delay locked loop having the duty cycle correction circuit, and more particularly, to a duty cycle correction circuit and a delay locked loop having the same, capable of controlling a duty rate of the duty cycles.

2. Description of the Related Art

Generally, a delay locked loop (DLL) receives external clock signals from outside a system and generates internal clock signals synchronized to the external clock signals. Here, the system includes devices such as logic devices or semiconductor devices using external clock signals.

For example, the DLL is applicable to a cash memory device for increasing a data transmission rate between a DRAM and a CPU of a computer, or a synchronous DRAMO, RAMBUS$^R$ DRAM, etc., as well as various type logic devices.

A double date rate (DDR) technique has been developed in order to improve bandwidths of memory systems. The memory systems uses rising edges and falling edges of internal clock signals. In that case, a duty cycle of the internal clock signal is an important factor for maintaining a timing margin maximally in a high performance memory system.

That is, in a case where the duty cycle of the internal clock signal is not exactly 50%, errors generated by an offset deviation from 50% reduce the timing margin of the high performance memory system. For this reason, a device for compensating distortion of the duty cycle due to changes in processes, voltages, and temperatures is necessary. That is, a duty cycle correction circuit used in the DLL is a circuit for correcting a duty cycle of an internal clock signal.

FIG. 1 is a block diagram of a conventional delay locked loop. Referring to FIG. 1, a DLL 100 comprises a DLL core 110, a clock buffer 130, and a duty cycle correction circuit 150.

The DLL core 110 as an important component of the DLL receives an external clock signal ECLK, and generates an internal clock signal ICLK synchronized to the external clock signal ECLK.

The clock buffer 130 includes a plurality of inverters 131, 133, 135, . . . , 137 connected serially to each other, buffers the internal clock signal ICLK, and generates a reference clock signal CLK and a complementary reference clock signal CLKB.

The inverter 131, as known well in the related field, consists of a PMOS transistor P1 and a NMOS transistor N1 that are serially connected between a source voltage VDD and a ground voltage VSS. The remaining inverters 133, 135, . . . , 137 have the same construction as the inverter 131. A method for generating the reference clock signal CLK and the complementary reference clock signal CLKB is obvious to one of ordinary skill in the art.

In the case where the PMOS transistor P1 and the NMOS transistor N1 of the respective inverters 131, 133, 135, . . . , 137 are the same in a ratio of channel width to channel length, the clock buffer 130 can output differential clock signals (CLK/CLKB) each having a duty cycle of 50%.

However, in the case where the duty cycle of the differential reference clock signals CLK/CLKB is not exactly 50% but 45% or 55% (referred to as "in the case where a duty error is generated") due to changes of processes, voltages, and temperatures, the timing margin of the high performance memory system is reduced.

To solve this problem, the duty cycle correction circuit 150 converts the differential reference clock signals CLK/CLKB into duty offset information DCC/DCCB, and feeds back the duty offset information DCC/DCCB to the DLL core 110. Accordingly, the DLL core 110 controls the duty cycle of the internal clock signal ICLK to be exactly 50%, in response to the duty offset information DCC/DCCB.

However, since the duty cycle correction circuit 150 is always operated while the DLL 100 is being operated, it is not recognized whether the differential reference clock signals CLK/CLKB with the 50% duty cycle are generated by interoperation of the clock buffer 130 and the duty cycle correction circuit 150, or by a main operation of the clock buffer 130.

That is, in the case where a duty error is generated, it is difficult to correctly analyze whether the duty error is generated by the clock buffer 130 or by the duty cycle correction circuit 150.

SUMMARY OF THE INVENTION

The present invention provides a duty cycle correction circuit and a delay locked loop (DLL) having the same, capable of controlling its operations to correctly analyze and determine the cause of a duty error, in a case where the duty error is generated in the DLL.

According to an aspect of the present invention, there is provided a duty cycle correction circuit of a delay locked loop, comprising: a differential amplifier, which receives and amplifies differential reference clock signals through a first input terminal and a second input terminal, and outputs differential output signals to a first differential output terminal and a second differential output terminal, respectively; a first transmission circuit, which is connected between the first differential output terminal and a first node, and transmits a signal of the first differential output terminal to the first node, in response to transmission control signals; a second transmission circuit, which is connected between the second differential output terminal and a second node, and transmits a signal of the second differential output terminal to the second node, in response to the transmission control signals; a first storage unit, which is connected between the first node and a ground voltage and accumulates electric charges on the first node; a second storage unit, which is connected between the second node and the ground voltage and accumulates electric charges on the second node; and a current control circuit, which controls an amount of electric charges accumulated in the first storage unit and an amount of electric charges accumulated in the second storage unit, in response to a corresponding switching control signal.

Each of the first transmission circuit and the second transmission circuit can be a transmission gate, and each of the first storage unit and the second storage unit can be a MOS transistor.

According to another aspect of the present invention, there is provided a delay locked loop comprising: a DLL core, which receives an external clock signal and generates an internal clock signal synchronized to the external clock signal; a buffer, which buffers the internal clock signal and outputs differential reference clock signals; and a duty cycle correction circuit, which generates duty rate control signals each having a predetermined offset corresponding to a difference of respective duty cycles of the differential reference clock signals; and a control signal generation circuit, which generates switching control signals for controlling the offset, and outputs the switching control signals to the duty cycle correction circuit, wherein the DLL core corrects a duty cycle of the internal clock signal, in response to the duty rate control signals.

In one embodiment, the duty cycle correction circuit comprises a differential amplifier, a first transmission circuit, a second transmission circuit, a first storage unit, a second storage unit, and a control circuit. The differential amplifier receives and amplifies the differential reference clock signals through a first input terminal and a second input terminal and outputs differential output signals to a first differential output terminal and a second differential output terminal, respectively. The first transmission circuit is connected between the first differential output terminal and a first node and transmits a signal of the first differential output terminal to the first node, in response to transmission control signals. The second transmission circuit is connected between the second differential output terminal and a second node and transmits a signal of the second differential output terminal to the second node, in response to the transmission control signals. The first storage unit is connected between the first node and a ground voltage and accumulates electric charges on the first node. The second storage unit is connected between the second node and the ground voltage and accumulates electric charges on the second node. The control circuit controls an amount of electric charges accumulated in the first storage unit and an amount of electric charges accumulated in the second storage unit, in response to corresponding switching control signals.

BRIEF DESCRIPTION OF THE DRAWINGS

The foregoing and other objects, features and advantages of the invention will be apparent from the more particular description of a preferred embodiment of the invention, as illustrated in the accompanying drawing. The drawing is not necessarily to scale, emphasis instead being placed upon illustrating the principles of the invention.

FIG. 3 is a detailed circuit diagram of a duty cycle correction circuit shown in FIG. 2.

DETAILED DESCRIPTION OF THE INVENTION

Figure 1:
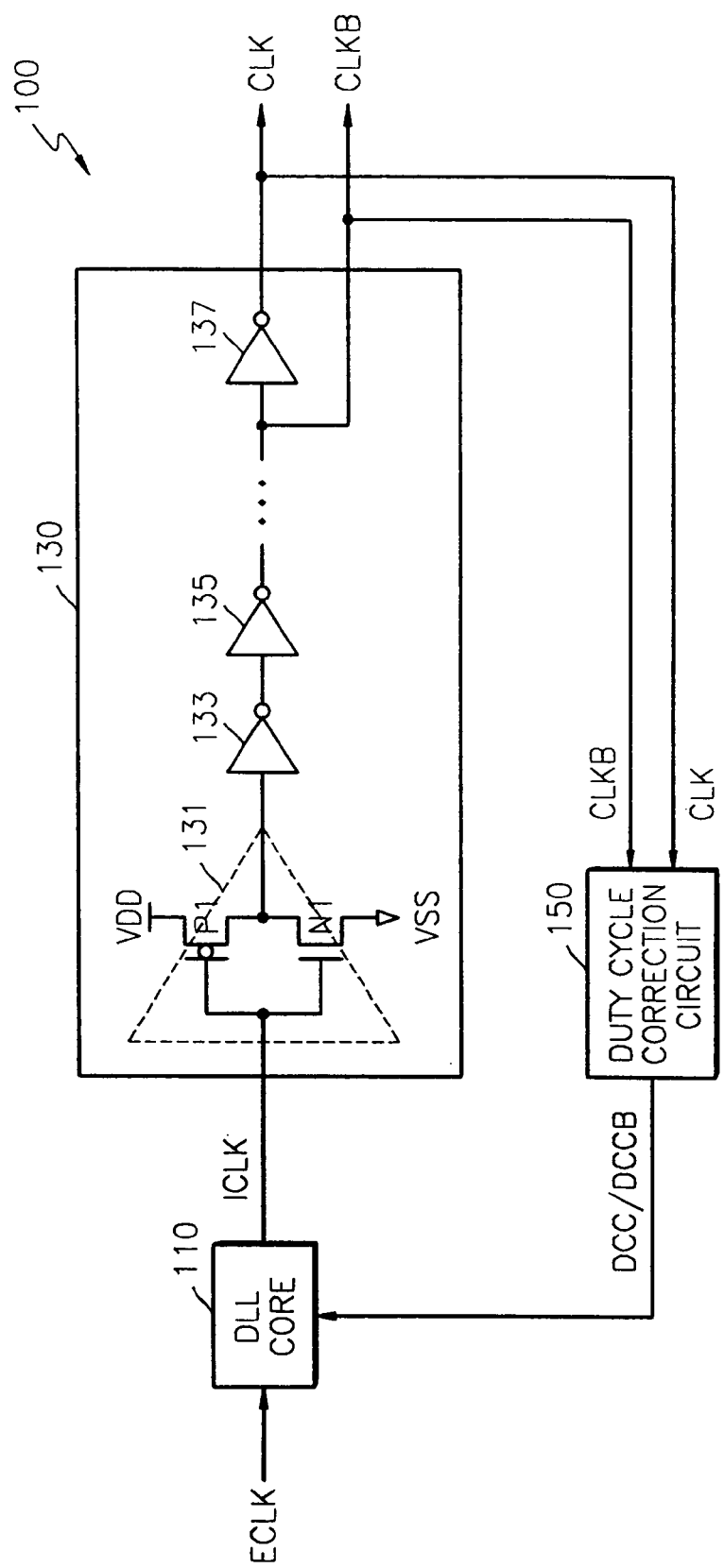
FIG. 1 is a block diagram of a conventional delay locked loop (DLL).
Figure 2:
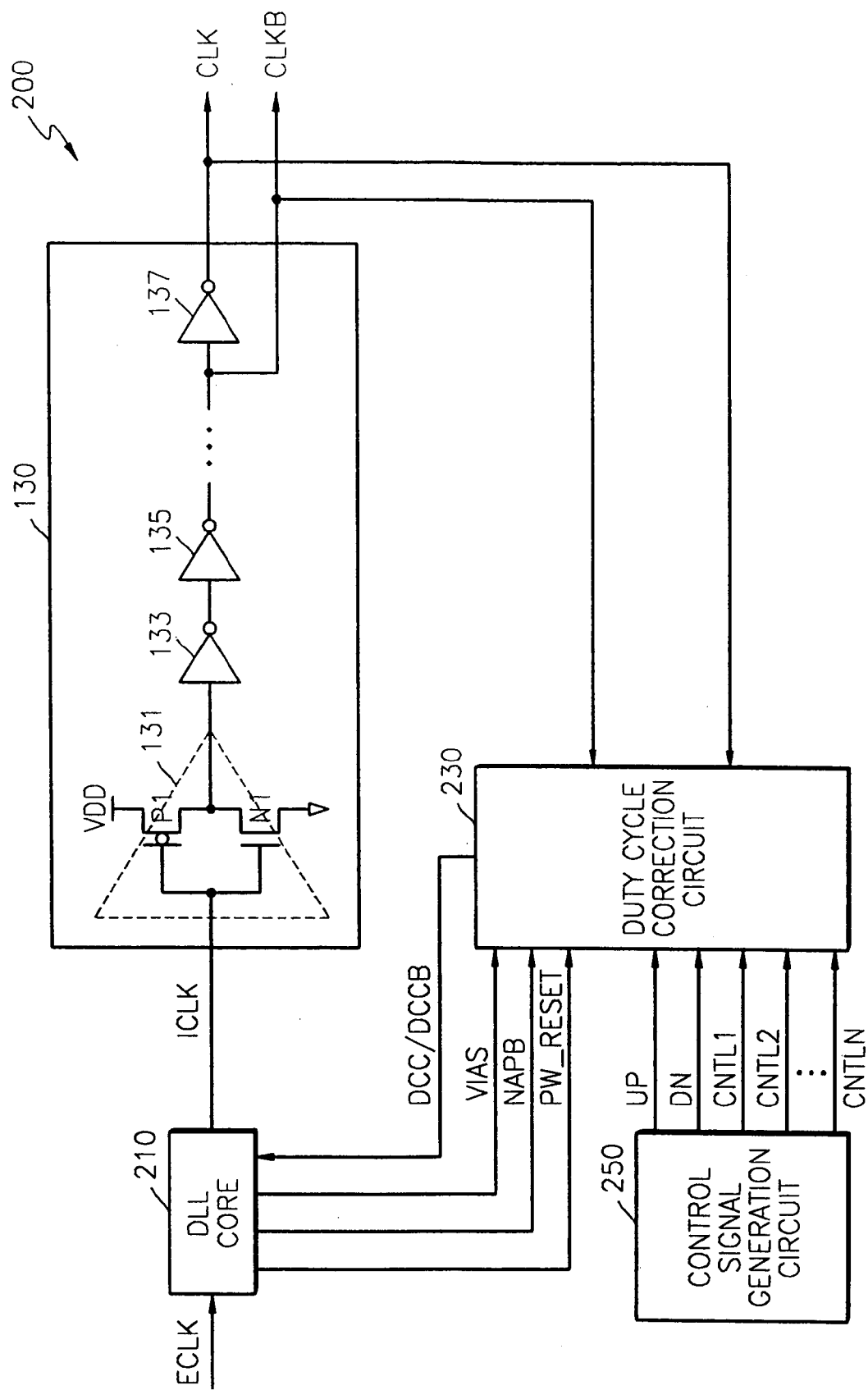
FIG. 2 is a block diagram of a DLL, according to an embodiment of the present invention.

FIG. 2 is a block diagram of a DLL, according to an embodiment of the present invention. Referring to FIG. 2, a DLL 200 comprises a DLL core 210, a clock buffer 130, a duty cycle correction circuit 230, and a control signal generation circuit 250.

The DLL core 210 receives an external clock signal ECLK and generates an internal clock signal ICLK synchronized to the external clock signal ECLK. The clock buffer 130 buffers the internal clock signal ICLK and generates differential reference clock signals CLK/CLKB.

The duty cycle correction circuit 230 generates duty rate control signals DCC/DCCB each having a predetermined offset corresponding to a difference between the respective duty cycles of the differential reference signals CLK/CLKB.

The control signal generation circuit 250 generates switching control signals UP, DN, CNTL1, CNTL2, . . . , CNTLN, and outputs these signals UP, DN, CNTL1, CNTL2, . . . , CNTLN to the duty cycle correction circuit 230.

The duty cycle correction circuit 230 controls the predetermined offset, in response to a combination of the switching control signals UP, DN, CNTL1, CNTL2, . . . , CNTLN.

The DLL core 210 corrects a duty cycle of the internal clock signal ICLK, in response to the duty rate control signals DCC/DCCB having the adjusted offset. Accordingly, the duty rate control signals DCC/DCCB includes duty offset information.

Figure 3:
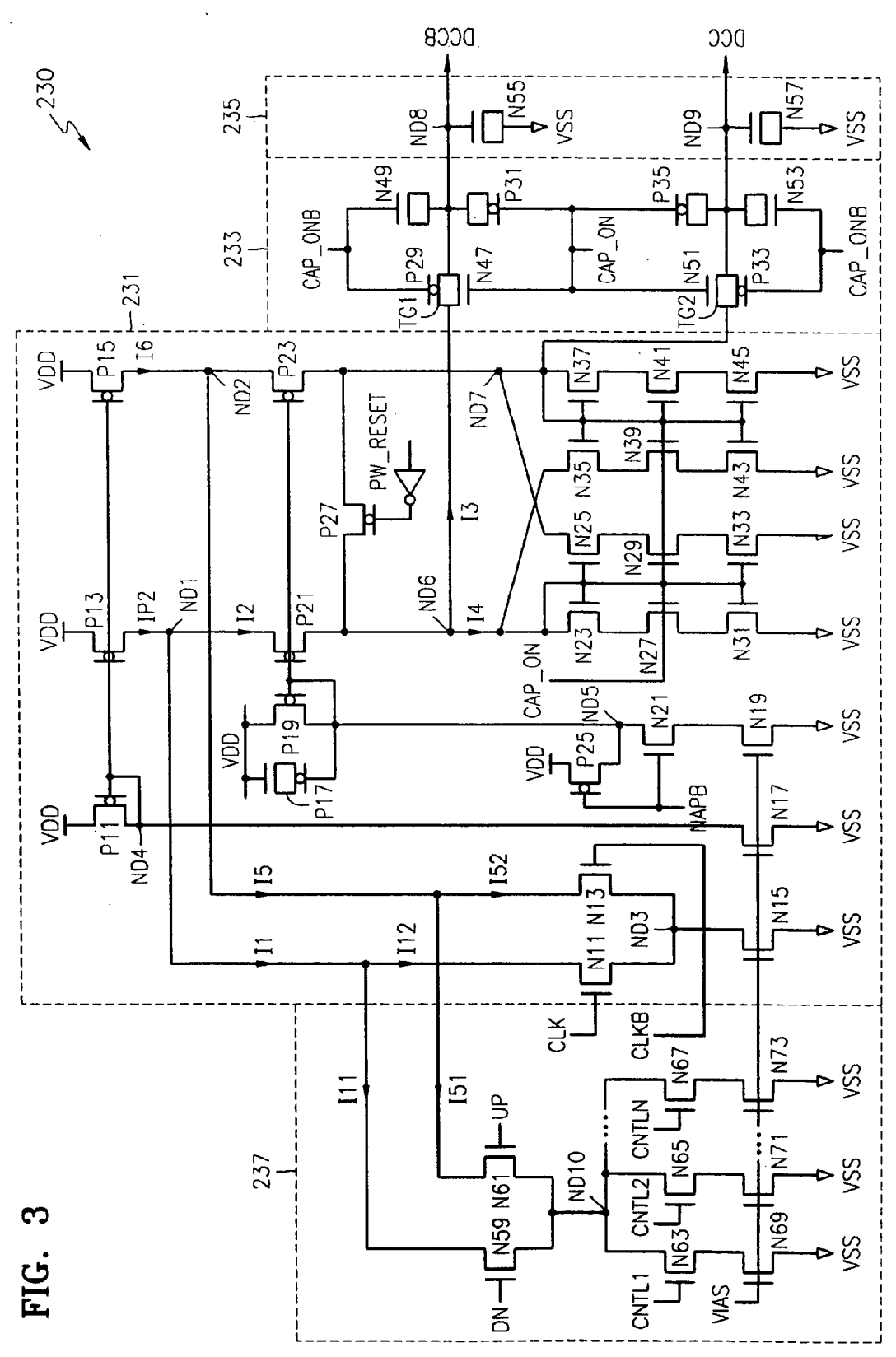

FIG. 3 is a detailed circuit diagram of the duty cycle correction circuit shown in FIG. 2. Referring to FIG. 3, the duty cycle correction circuit 230 comprises a differential amplifier 231, a transmission circuit 233, a storage unit 235, and a current control circuit 237.

The differential amplifier 231 receives to a reference clock signal CLK input to a gate (hereinafter, referred to as 'a first input terminal') of a NMOS transistor N11, and a complementary reference clock signal CLKB input to a gate (hereinafter, referred to as 'a second input terminal') of a NMOS transistor N13, amplifies a difference between both signals CLK and CLKB, and outputs amplified differential output signals though a first differential output terminal ND6 and a second differential output terminal ND7, respectively.

The transmission circuit 233 comprises a first transmission circuit TG1 and a second transmission circuit TG2. The first transmission circuit TG1 consists of a PMOS transistor P29 and a NMOS transistor N47. The second transmission circuit TG2 consists of a PMOS transistor P33 and a NMOS transistor N51.

The first transmission circuit TG1 is connected between the first differential output terminal ND6 and a first node ND8, and transmits a signal (for example, a current) from the first differential output terminal ND6 to the first node ND8, in response to transmission control signals CAP_ON and CAP_ONB output from the DLL core 210.

The second transmission circuit TG2 is connected between the second differential output terminal ND7 and a second node ND9, and transmits a signal (for example, a current) from the second differential output terminal ND7 to the second node ND9, in response to the transmission control signals CAP_ON and CAP_ONB. The control signals CAP_ON and CAP_ONB are complementary signals.

The storage unit 235 comprises a first storage unit N55 and a second storage unit N57. The first storage unit N55 is connected between the first node ND8 and a ground voltage VSS and accumulates electric charges on the first node ND8. The first storage unit N55 consists of a NMOS transistor.

The second storage unit N57 is connected between the second node ND9 and the ground voltage VSS and accumulates electric charges on the second node ND9. The second storage unit N57 consists of a NMOS transistor.

The current control circuit 237 controls an amount of electric charges accumulated in the first storage unit N55 and an amount of electric charges accumulated in the second storage unit N57, in response to the corresponding switching control signals UP, DN, CNTL1, CNTL2, . . . , CNTLN.

A transistor N59 is connected between a node ND1 and a node ND10. A down control signal DN is input to the gate of the transistor N59. A transistor N61 is connected between a node ND2 and the node N1. An up control signal UP is input to the gate of the transistor N61.

The down control signal DN is a control signal for reducing a duty rate, and the up control signal UP is a control signal for increasing a duty rate. The down control signal DN and the up control signal UP are preferably not activated at a same time.

Transistors N63 and N69 are connected in series, transistors N65 and N71 are connected in series, and transistors N67 and N73 are connected in series. The respective current control signals CNTL1, CNTL2, and CNTLN are input to the gates of the corresponding transistors N63, N65, and N67, respectively.

A ratio of channel length to channel width of the respective transistors N63, N65, and N67 can be increased by $2^N$ wherein N is a natural number. Accordingly, the current flowing through the transistor N67 is $2^N$ times the current flowing through the transistor N63.

Referring to FIGS. 2 and 3, the operations of the duty cycle correction circuit 230 of the delay locked loop will be described. First, the detailed operations of the differential amplifier 231 are described below.

If a bias voltage VIAS output from the DLL core 210 is activated to a 'high' level, NMOS transistors N15, N17, and N19 and PMOS transistors P11, P13, and P15 acting as current sources are turned-on, thereby operating the differential amplifier 231.

If a mode control signal NAPB output from the DLL core 210 is activated to a 'high' level, a NMOS transistor N21 is turned-on and therefore the voltage of a node ND5 is pulled-down to the ground voltage VSS through the turned-on NMOS transistors N21 and N19. When the voltage of the node ND5 is pulled-down to the ground voltage VSS, a PMOS type capacitor P17 and PMOS transistors P19, P21, and P23 formed a current mirror structure are turned-on, respectively.

The voltages on the respective nodes ND1 and ND2 are differential-amplified by the operations of NMOS transistors N11 and N13 that are turned-on or turned-off in response to the states of the differential reference clocks CLK/CLKB. The amplified signals of the respective nodes ND1 and ND2 are transmitted to the first differential output terminal ND6 and the second differential output terminal ND7, respectively, through the turned-on respective transistors P21 and P23.

The output terminal with a 'high' level among the differential output terminals ND6 and ND7 is changed into a 'low' level, since a current pass is formed to the ground voltage VSS through NMOS transistors N27, N29, N39, and N41 turned-on by an activated transmission control signal CAP_ON. The output terminal with a 'low' level among the differential output terminals ND6 and ND7 is changed into a 'high' level by a source voltage VDD supplied through PMOS transistors P13 and P15, P15 and P23 formed a current mirror structure, since a current pass is not formed to the ground voltage VSS.

Accordingly, if the bias voltage VIAS is in a 'high' level, the mode control signal NAPB is in a 'high' level, the power reset signal PW_RESET is in a 'low' level, differential signals corresponding to the respective differential reference clock signals CLK/CLKB are output to the respective differential output terminals ND6 and ND7.

If the bias voltage VIAS is in a 'high' level, the mode control signal NAPB and the transmission control signal CAP_ON are in a 'low' level, and the power reset signal PW_RESET is in a 'high' level, the NMOS transistor N21 is turned-off, a PMOS transistor P25 are turned-on, and therefore the voltage of the node ND5 becomes a 'high' level. Accordingly, the PMOS type capacitor P17 and the PMOS transistors P11, P13, and P15 formed the current mirror, are turned-off, respectively.

Since the transistors N27, N29, N39, and N41 are turned-off, the operation of the differential amplifier 231 is non-activated. At this time, the differential output terminals ND6 and ND7 are equalized by a PMOS transistor P27.

The transmission control signal CAP_ON is input to the gates of the respective NMOS transistors N47 and N51 and the gates of the respective PMOS transistors P31 and P35. The complementary transmission control signal CAP_ONB is input to the gates of the respective NMOS transistors N49 and N53 and the gates of the respective PMOS transistors P29 and P33. The NMOS transistors N49 and the PMOS transistor P31 form a capacitor and the NMOS transistor N53 and the PMOS transistor P35 also form a capacitor.

The first transmission circuit TG1 transmits a signal from the first differential output terminal ND6 as a second duty rate control signal DCCB to the first node ND8, in response to the transmission control signals CAP_ON and CAP_ONB. The second transmission circuit TG2 transmits a signal from the second differential output terminal ND7 as a first duty rate control signal DCC to the second node ND9, in response to the transmission control signals CAP_ON and CAP_ONB.

Between the first duty rate control signal DCC and the second duty rate control signal DCCB exists an offset that is decided by a duty cycle. In the case where an ideal duty cycle is 50%, the offset is zero.

The first storage unit N55 stores electric charges on the first node ND8 during a predetermined time period and the second storage unit N57 stores electric charges on the second node ND9 during a predetermined time period.

Figure 4:
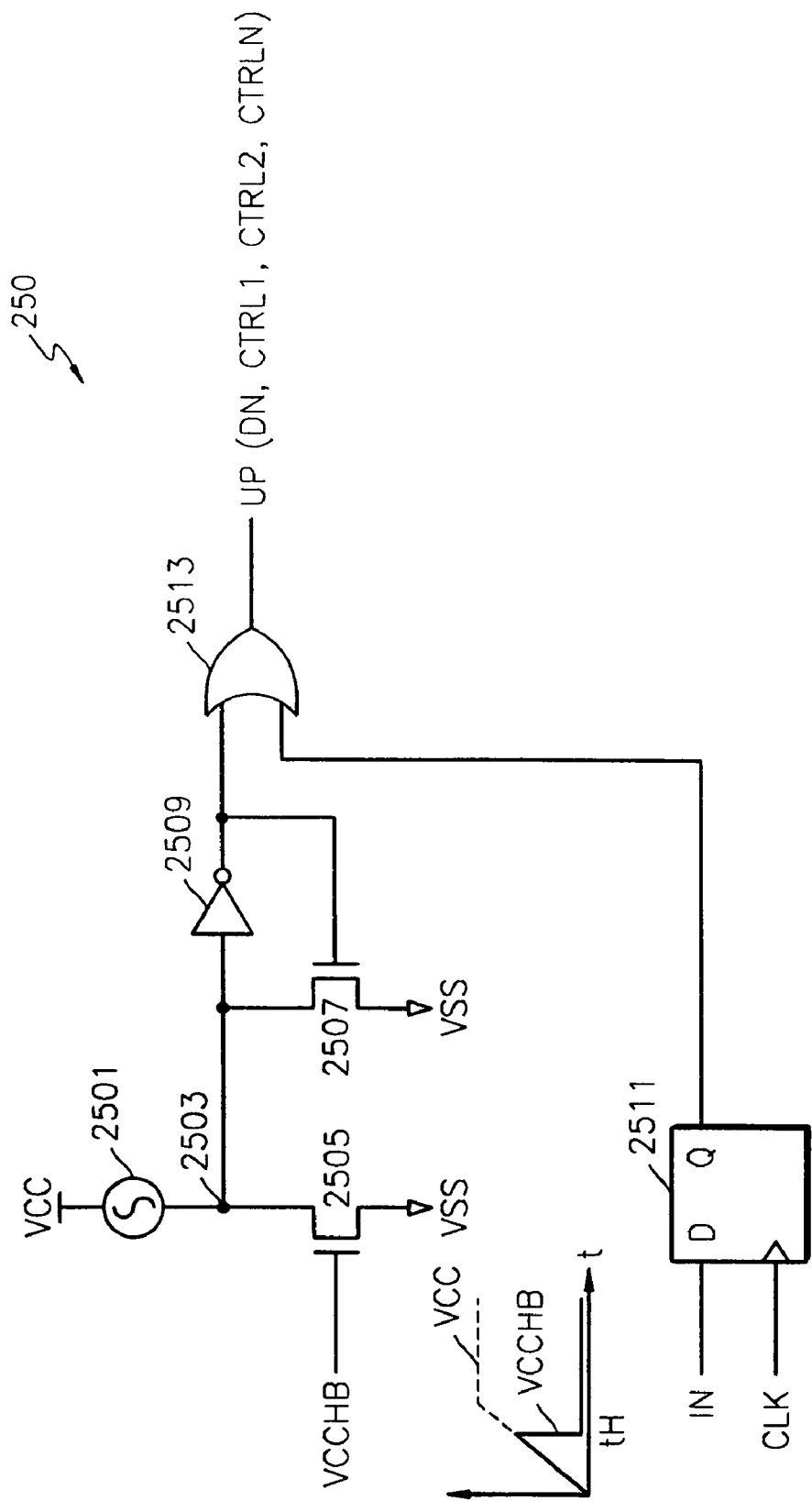
FIG. 4 is a circuit diagram of a control signal generation circuit shown in FIG. 2.

FIG. 4 is a circuit diagram of a control signal generation circuit shown in FIG. 2. A fuse 2501 is connected between a source voltage VCC and a node 2503. Respective transistors 2505 and 2507 are connected, respectively, between the node 2503 and a ground voltage VSS. A power-up signal VCCHB is input to the gate of the transistor 2505. The output terminal of an inverter 2509 is connected to the gate of the transistor 2507.

An OR gate 2513 receives an output signal from the inverter 2509 and an output signal from a flip-flop 2511, performs a logic operation of both output signals, and generates an up control signal UP as the operation result. The flip-flop 2511 latches an input signal IN received through its input terminal D, in response to a clock signal CLK.

Referring to FIGS. 2 and 4, if each of the duty cycles of the reference clock CLK and the complementary reference clock CLKB is 50% and all of the switching control signals DN, UP, CNTL1, CNTL2, and CNTLN are non-active, the amount of electric charges accumulated in the first storage unit N55 is the same as that accumulated in the second storage unit N57, since a current I2 flowing through a PMOS transistor P21 is the same as a current I6 flowing through a PMOS transistor P23. If all of the switching control signals DN, UP, CNTL1, CNTL2, and CNTLN are non-active, a current IP2 flowing through the PMOS transistor P13 is represented by Equation 1 below.

$$IP2 = I1 + I2 \qquad (1)$$

However, if the duty cycles of the reference clock CLK and the complementary reference clock CLKB are, respectively, 50% by a combination of the respective switching control signals DN, UP, CNTL1, CNTL2, and CNTLN, the amount of electric charges accumulated in the first storage unit N55 may not be the same as that accumulated in the second storage unit N57.

For example, if at least one control signal among the down control signal DN and the switching control signals CNTL1, CNTL2, and CNTLN is active, a current IP2 flowing through the PMOS transistor P13 is represented by Equation 2 below.

$$IP2 = I11 + I12 + I2 \quad (2)$$

Here, I11 is the current flowing toward the NMOS transistor N59 and I12 is the current flowing toward the NMOS transistor N11.

Since IP2 is the same in Equations 1 and 2, and I11 and I12 are always constant, the current I2 flowing through the PMOS transistor P21 is reduced. Accordingly, since the amount of electric charges accumulated in the first storage unit N55 is reduced, the offset between the duty rate control signals DCC and DCCB is changed.

Therefore, the duty cycle can be controlled, by appropriately adjusting the amount of electric charges accumulated in the first storage unit N55 and the second storage unit N59, using a combination of the up control signal UP and the respective switching control signals CNTL1, CNTL2, and CNTLN or using a combination of the down control signal DN and the respective switching control signals CNTL1, CNTL2, and CNTLN.

Accordingly, if a duty error is generated in the DLL 200 including the duty cycle correction circuit 230, the duty cycle of the reference clock signal CLK is exactly 50%, regardless of the duty error generated in the clock buffer 130 and/or the duty cycle correction circuit 230.

As described above, according to the present invention, in the case where a duty error is generated in a DLL including a duty cycle correction circuit, a debugging time of the DLL or a system including the DLL can be minimized.

Also, the DLL including the duty cycle correction circuit, according to the present invention, can easily control its duty cycle.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop comprising:
   a DLL core, which receives an external clock signal and generates an internal clock signal synchronized to the external clock signal;
   a buffer, which buffers the internal clock signal and outputs differential reference clock signals; and
   a duty cycle correction circuit, which generates duty rate control signals each having a predetermined offset corresponding to a difference of respective duty cycles of the differential reference clock signals; and
   a control signal generation circuit, which generates a combination of duty cycle switching signals and corresponding current switching control signals for controlling the offset, and outputs the combination of the duty cycle switching signals and corresponding current switching control signals to the duty cycle correction circuit,
   wherein the DLL core corrects a duty cycle of the internal clock signal, in response to the duty rate control signals.

2. The delay locked loop of claim 1, wherein the duty cycle correction circuit comprises:
   a differential amplifier, which receives and amplifies the differential reference clock signals through a first input terminal and a second input terminal, and outputs differential output signals to a first differential output terminal and a second differential output terminal, respectively;
   a first transmission circuit, which is connected between the first differential output terminal and a first node, and transmits a signal of the first differential output terminal to the first node, in response to transmission control signals;
   a second transmission circuit, which is connected between the second differential output terminal and a second node, and transmits a signal of the second differential output terminal to the second node, in response to the transmission control signals;
   a first storage unit, which is connected between the first node and a ground voltage and accumulates electric charges on the first node;
   a second storage unit, which is connected between the second node and the ground voltage and accumulates electric charges on the second node; and
   a control circuit, which controls an amount of electric charges accumulated in the first storage unit and an amount of electric charges accumulated in the second storage unit, in response to corresponding switching control signals.

3. A delay locked loop comprising:
   a DLL core, which receives an external clock signal and generates an internal clock signal synchronized to the external clock signal;
   a buffer, which buffers the internal clock signal and outputs differential reference clock signals; and
   a duty cycle correction circuit, which generates duty rate control signals each having a predetermined offset corresponding to a difference of respective duty cycles of the differential reference clock signals, the duty cycle correction circuit comprising:
      a differential amplifier, which receives and amplifies the differential reference clock signals through a first input terminal and a second input terminal, and outputs differential output signals to a first differential output terminal and a second differential output terminal, respectively;
      a first transmission circuit, which is connected between the first differential output terminal and a first node, and transmits a signal of the first differential output terminal to the first node, in response to transmission control signals;
      a second transmission circuit, which is connected between the second differential output terminal and a second node, and transmits a signal of the second differential output terminal to the second node, in response to the transmission control signals;
      a first storage unit, which is connected between the first node and a ground voltage and accumulates electric charges on the first node;

a second storage unit, which is connected between the second node and the ground voltage and accumulates electric charges on the second node; and a control circuit, which controls an amount of electric charges accumulated in the first storage unit and an amount of electric charges accumulated in the second storage unit, in response to switching control signals, the switching control signals comprising a combination of duty cycle switching signals and corresponding current switching control signals; and a control signal generation circuit, which generates the switching control signals for controlling the offset, and outputs the switching control signals to the duty cycle correction circuit, wherein the DLL core corrects a duty cycle of the internal clock signal, in response to the duty rate control signals.

* * * * *